United States Patent

Hasegawa et al.

(10) Patent No.: US 10,741,472 B2
(45) Date of Patent: Aug. 11, 2020

(54) POWER MODULE

(71) Applicant: Mitsubishi Electric Corporation, Tokyo (JP)

(72) Inventors: Maki Hasegawa, Tokyo (JP); Shuhei Yokoyama, Tokyo (JP); Shigeru Mori, Tokyo (JP); Hisashi Kawafuji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/953,522

(22) Filed: Apr. 16, 2018

(65) Prior Publication Data

US 2019/0115283 A1  Apr. 18, 2019

(30) Foreign Application Priority Data

Oct. 17, 2017  (JP) .................. 2017-201171

(51) Int. Cl.

| H01L 23/40 | (2006.01) |
|---|---|
| H01L 23/34 | (2006.01) |
| H01L 23/495 | (2006.01) |
| H01L 23/00 | (2006.01) |
| H01L 23/31 | (2006.01) |
| H03K 17/567 | (2006.01) |
| H01L 23/367 | (2006.01) |

(52) U.S. Cl.
CPC ...... *H01L 23/4093* (2013.01); *H01L 23/3107* (2013.01); *H01L 23/562* (2013.01); *H01L 23/3672* (2013.01); *H01L 23/49541* (2013.01); *H01L 23/49548* (2013.01); *H01L 2224/48137* (2013.01); *H01L 2224/48247* (2013.01); *H01L 2924/181* (2013.01); *H03K 17/567* (2013.01)

(58) Field of Classification Search
CPC . H01L 23/4093; H01L 23/3672; H01L 23/40; H01L 23/34; H01L 23/495; H03K 17/567
See application file for complete search history.

(56) References Cited

U.S. PATENT DOCUMENTS

| 5,521,439 | A |  | 5/1996 | Casati et al. |  |
|---|---|---|---|---|---|
| 2002/0190374 | A1 | * | 12/2002 | Nakajima | ............. H01L 21/565 257/707 |
| 2003/0075783 | A1 | * | 4/2003 | Yoshihara | ........... H01L 23/4334 257/675 |
| 2008/0017882 | A1 | * | 1/2008 | Nakanishi | ............. H01L 23/562 257/177 |

(Continued)

FOREIGN PATENT DOCUMENTS

JP  H06-310632 A  11/1994

*Primary Examiner* — Kenneth Parker
*Assistant Examiner* — Long H Le
(74) *Attorney, Agent, or Firm* — Studebaker & Brackett PC

(57) ABSTRACT

A power module includes: a power chip; a control chip controlling the power chip; a power terminal connected to the power chip; a control terminal connected to the control chip; and a package covering the power chip, the control chip, the power terminal, and the control terminal with mold resin, wherein first and second recesses for attaching a fin are respectively provided on side faces facing each other of the package from which neither the power terminal nor the control terminal protrudes, and the first and second recesses are arranged not at positions opposite to each other but alternately.

17 Claims, 5 Drawing Sheets

(56) References Cited

U.S. PATENT DOCUMENTS

| | | | | |
|---|---|---|---|---|
| 2011/0049531 A1* | 3/2011 | Oka | ................... | H01L 21/565 |
| | | | | 257/77 |
| 2015/0155228 A1* | 6/2015 | Ikeda | ............... | H01L 23/49575 |
| | | | | 257/140 |
| 2015/0255367 A1* | 9/2015 | Nakahara | ........... | H01L 23/3735 |
| | | | | 257/712 |

* cited by examiner

POWER MODULE

BACKGROUND OF THE INVENTION

Field

The present invention relates to a power module.

Background

Power modules, packages of which are provided with recesses for allowing attachment of fins, are used. In conventional power modules, two recesses are symmetrically arranged on a center line in a transverse or longitudinal direction of each package (e.g., see JP 06-310632 A).

SUMMARY

When a fin is attached to a conventional power module, there is a problem that the fin flops, and stress caused by the flopping may damage the package.

The present invention has been implemented to solve the above-described problem and it is an object of the present invention to provide a power module capable of reducing flopping of an attached fin and distributing stress caused by the flopping.

According to the present invention, a power module includes: a power chip; a control chip controlling the power chip; a power terminal connected to the power chip; a control terminal connected to the control chip; and a package covering the power chip, the control chip, the power terminal, and the control terminal with mold resin, wherein first and second recesses for attaching a fin are respectively provided on side faces facing each other of the package from which neither the power terminal nor the control terminal protrudes, and the first and second recesses are arranged not at positions opposite to each other but alternately.

In the present invention, the first and second recesses are provided on the side faces of the package. This allows attachment of the fin and an improvement of heat dissipation can be expected. The first and second recesses are arranged not at positions opposite to each other but alternately. This reduces flopping of the attached fin and can distribute stress caused by the flopping.

Other and further objects, features and advantages of the invention will appear more fully from the following description.

DESCRIPTION OF EMBODIMENTS

Figure 1:
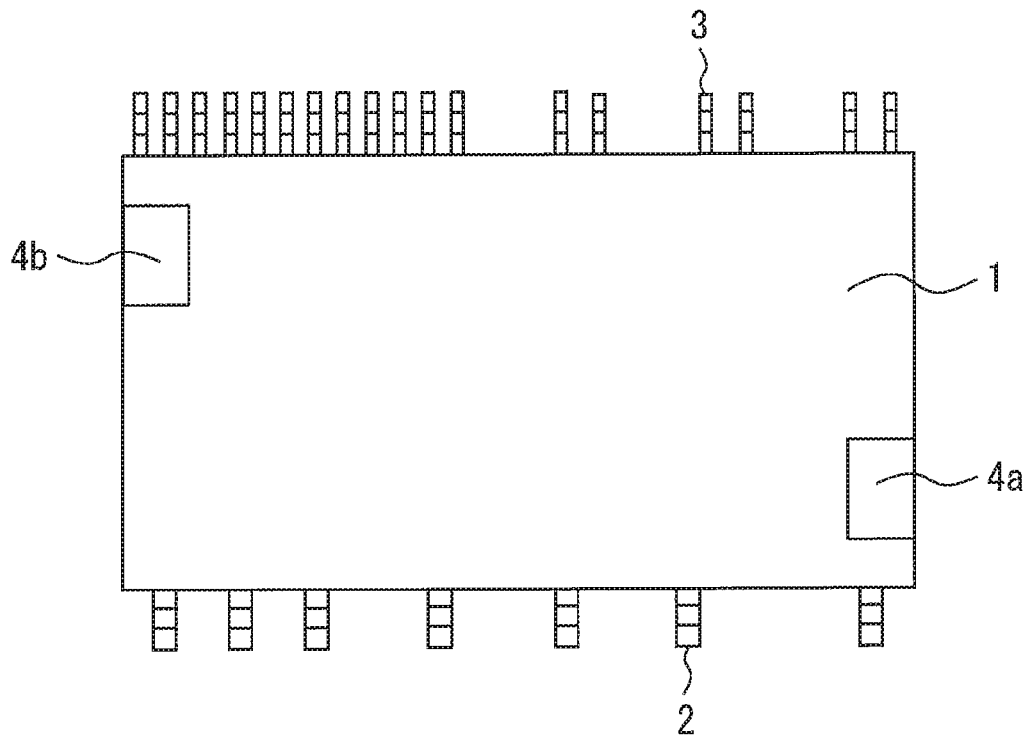
FIG. 1 is a plan view illustrating a power module according to an embodiment.
Figure 2:
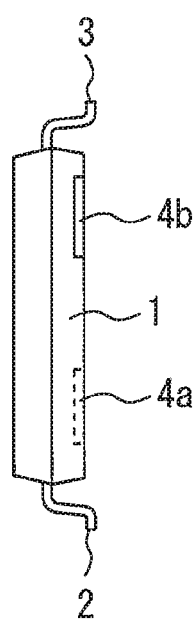
FIG. 2 is a side view illustrating the power module according to the embodiment.

FIG. 1 is a plan view illustrating a power module according to an embodiment. FIG. 2 is a side view illustrating the power module according to the embodiment. Power terminals 2 and control terminals 3 protrude from their respective side faces facing each other of a package 1. First and second recesses 4a and 4b are respectively provided on side faces of the package 1 from which neither power terminal 2 nor control terminal 3 protrudes. The first and second recesses 4a and 4b are arranged not at positions opposite to each other but alternately.

Figure 3:
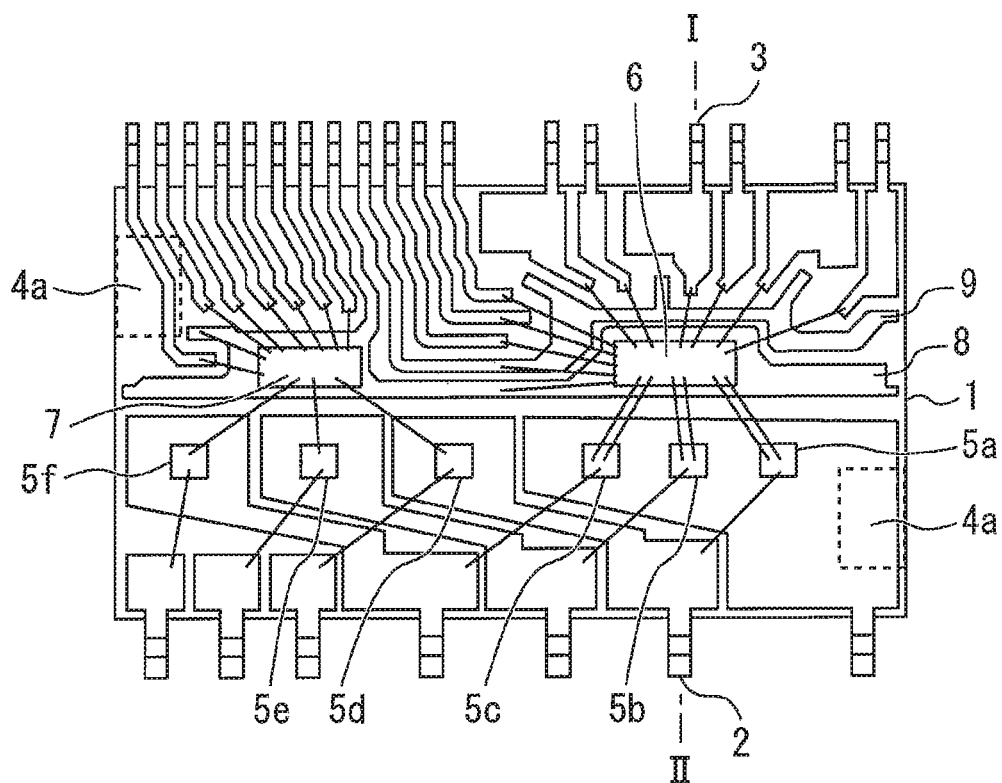
FIG. 3 is a plan view illustrating an inner structure of the power module according to the embodiment.
Figure 4:
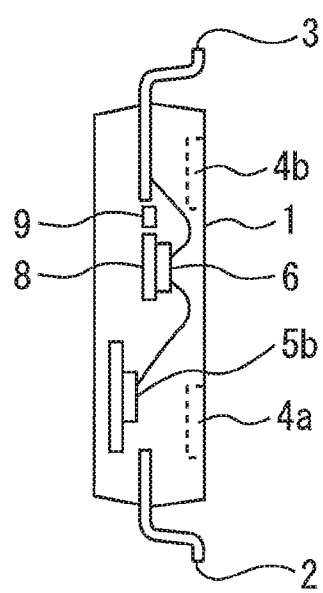
FIG. 4 is a cross-sectional view along I-II in FIG. 3.
Figure 5:
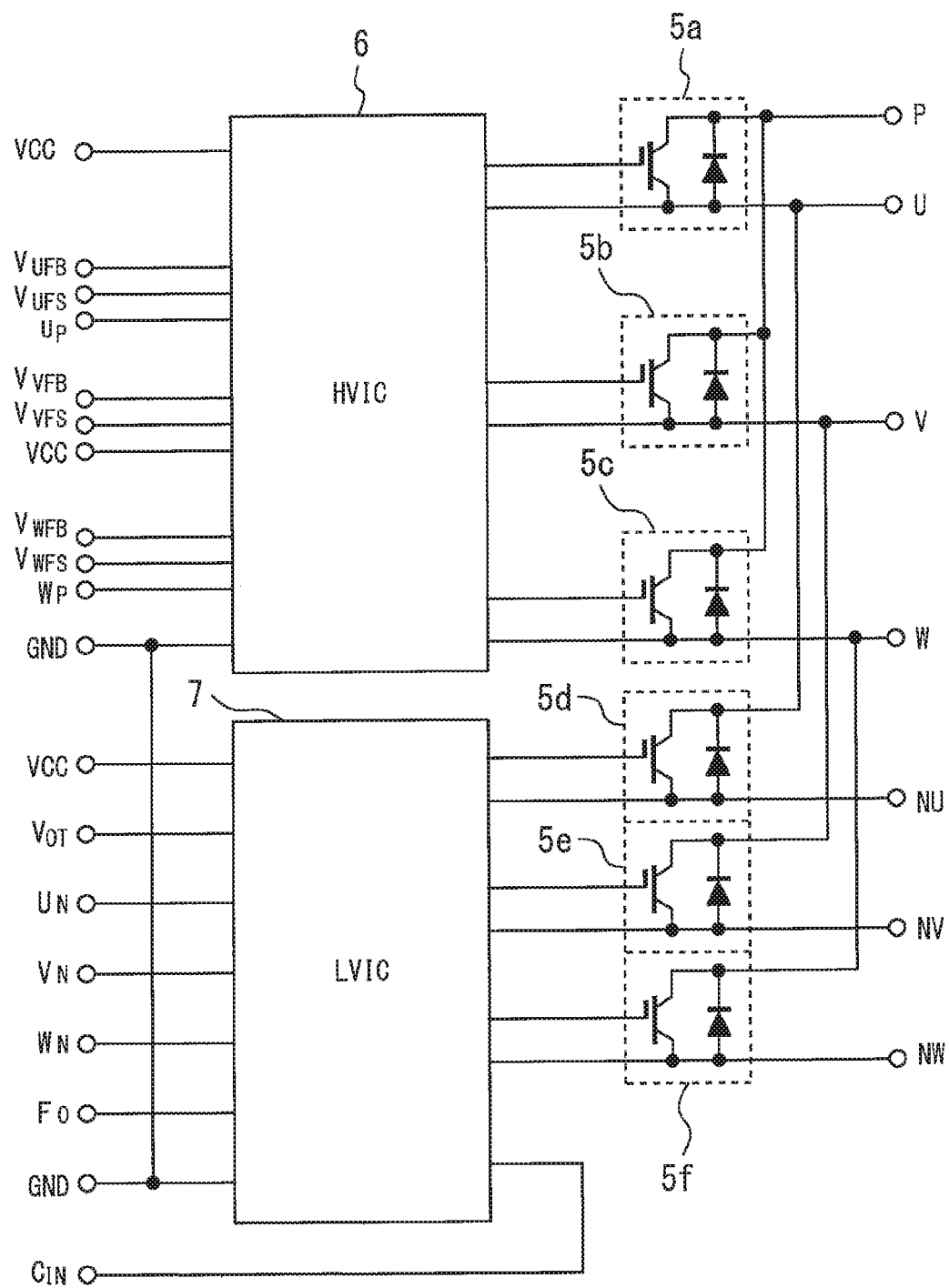
FIG. 5 is a circuit diagram of the power module according to the embodiment.

FIG. 3 is a plan view illustrating an inner structure of the power module according to the embodiment. FIG. 4 is a cross-sectional view along I-II in FIG. 3. FIG. 5 is a circuit diagram of the power module according to the embodiment.

Six power chips 5a to 5f are mounted on a metal frame. An HVIC 6 and an LVIC 7 are mounted on a ground terminal 8. The power chips 5a to 5c are high-voltage power chips to which high voltages are applied. The power chips 5d to 5f are low-voltage power chips to which lower voltages than the voltages applied to the high-voltage power chips are applied. The HVIC 6 is a high-voltage control chip that controls the power chips 5a to 5c. The LVIC 7 is a low-voltage control chip that controls the power chips 5d to 5f. The power chips 5a to 5f are RCIGBTs (reverse conducting insulated gate bipolar transistors) in which an IGBT and an FWD are built in the same chip. Note that the power chips 5a to 5f may also be a MOSFET or may include capacitors or the like.

The package 1 is formed by covering the power terminal 2, the control terminal 3, the power chips 5a to 5f, the HVIC 6, the LVIC 7, the ground terminal 8 and a power terminal 9 with mold resin. The respective components inside the package 1 are connected to each other via wires.

Figure 6:
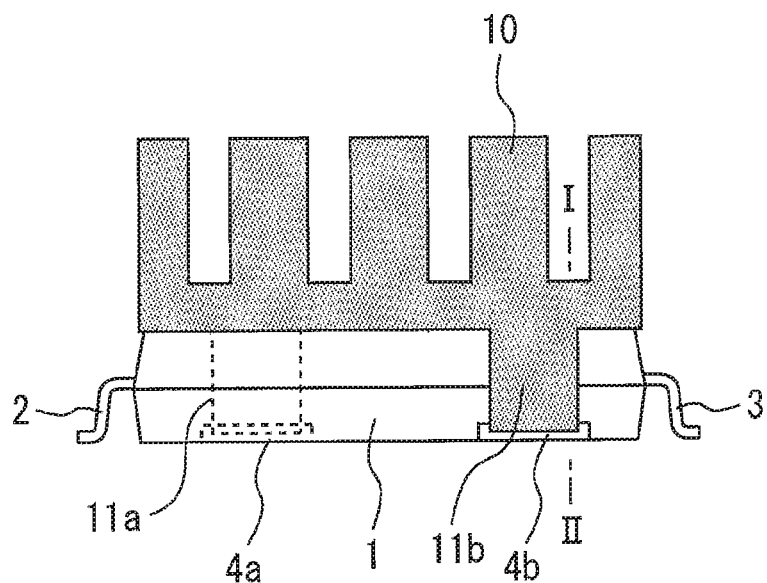
FIG. 6 is a side view illustrating the power module to which a fin according to the embodiment is attached.
Figure 7:
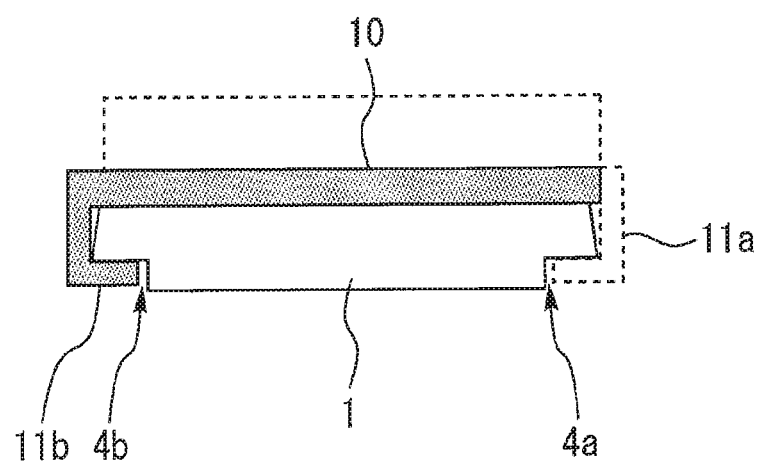
FIG. 7 is a cross-sectional view along I-II in FIG. 6.

FIG. 6 is a side view illustrating the power module to which a fin according to the embodiment is attached. FIG. 7 is a cross-sectional view along I-II in FIG. 6. A fin 10 is attached to the package 1 by causing elastic lugs 11a and 11b of the fin 10 to engage with the first and second recesses 4a and 4b respectively. The package 1 has a first main face with which a main face of the fin 10 is in contact and a second main face opposite to the first main face. The first and second recesses 4a and 4b are provided on the second main face side. When the power module is mounted on the substrate, the second main face becomes the substrate side.

Figure 8:
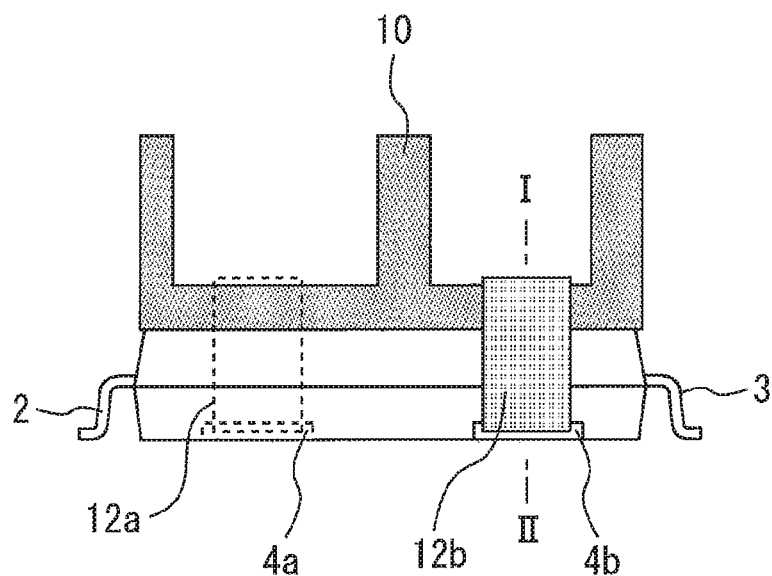
FIG. 8 is a side view illustrating a modification of the power module to which the fin according to the embodiment is attached.
Figure 9:
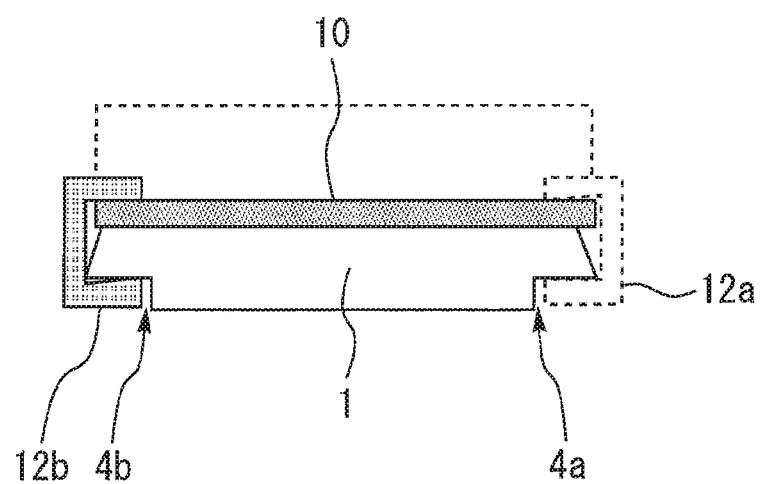
FIG. 9 is a cross-sectional view along I-II in FIG. 8.

FIG. 8 is a side view illustrating a modification of the power module to which the fin according to the embodiment is attached. FIG. 9 is a cross-sectional view along I-II in FIG. 8. The fin 10 is attached to the package 1 by causing elastic clips 12a and 12b to engage with the first and second recesses 4a and 4b, and the fin 10.

In the present embodiment, the first and second recesses 4a and 4b are provided on the side faces of the package 1. This allows attachment of the fin 10 and an improvement of heat dissipation can be expected. The first and second recesses 4a and 4b are arranged not at positions opposite to each other but alternately. This reduces flopping of the attached fin 10 and can distribute stress caused by the flopping.

The first main face of the package 1 to which the fin 10 is attached preferably has a convex warp. In this way, it is possible to reduce an amount of warp of the package 1 when the fin 10 is attached and bring the package 1 into close contact with the fin 10.

Since conventional semiconductor devices such as IC packages are supposed to be used at a low voltage, inner electrodes are exposed from a side face on which recesses for attaching the fin are provided. However, since the attached fin may come into contact with the inner electrodes and it may be impossible to secure insulation, the conventional configuration is not applicable to power modules to which high voltages are applied. In contrast, in the present embodiment, no inner electrode such as the power terminal 9 and the control terminal 3 is exposed from the side faces of the package 1 on which the first and second recesses 4a and 4b for attaching the fin 10 are provided. It is thereby possible to prevent the ground terminal 8 and the power terminal 9 from coming into contact with the fin 10, causing both terminals to have the same potential. Therefore, the module can be driven while the fin 10 is in a floating state and the grounding of the fin 10 and the grounding of an external power supply can be used separately when the power module is used.

When the first and second recesses 4a and 4b are located in a region where the power chips 5a to 5f are located or wires are running, there are problems such as an insulation distance from a high-voltage part becoming insufficient, leading to dielectric breakdown or wires becoming exposed. Thus, a wider die pad is provided and the first recess 4a is positioned on the power chips 5a to 5c sides where there is no interference of wires. Moreover, the second recess 4b is positioned on the LVIC 7 side to which no high voltage is applied. In this way, it is possible to arrange the first and second recesses 4a and 4b without increasing the size of the package, and thereby downsize the package.

The power chips 5a to 5f are not limited to chips formed of silicon, but instead may be formed of a wide-bandgap semiconductor having a bandgap wider than that of silicon. The wide-bandgap semiconductor is, for example, a silicon carbide, a gallium-nitride-based material, or diamond. A power chips formed of such a wide-bandgap semiconductor have a high voltage resistance and a high allowable current density, and thus can be miniaturized. The use of such a miniaturized power chips enable the miniaturization and high integration of the power module in which the power chips are incorporated. Further, since the power chips have a high heat resistance, the fin 10 can be miniaturized and a water-cooled part can be air-cooled, which leads to further miniaturization of the power module. Further, since the power chips have a low power loss and a high efficiency, a highly efficient power module can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-201171, filed on Oct. 17, 2017 including specification, claims, drawings and summary, on which the Convention priority of the present application is based, is incorporated herein by reference in its entirety.

The invention claimed is:

1. A power module comprising:
   a power chip;
   a control chip controlling the power chip;
   a power terminal connected to the power chip;
   a control terminal connected to the control chip; and
   a package covering the power chip, the control chip, the power terminal, and the control terminal with mold resin, the package having first and second main faces facing each other, wherein
   first and second recesses are provided on the second main face, which is opposite to the first main face that is in direct contact with a fin, and are respectively provided on opposite side faces of the package, the opposite side faces facing each other and being side faces from which neither the power terminal nor the control terminal protrudes,
   the first and second recesses are configured to receive and engage at least one lug of the fin, to attach the fin to the package, and
   the first and second recesses are arranged at positions that are not directly opposite to each other on the second main face, such that there are no recesses arranged directly opposite to each other.

2. The power module according to claim 1, wherein the first main face of the package has a convex warp.

3. The power module according to claim 2, wherein no inner electrode is exposed from the side faces of the package on which the first and second recesses are provided.

4. The power module according to claim 3, wherein the power chip includes a high-voltage power chip and a low-voltage power chip to which a lower voltage than a voltage applied to the high-voltage power chip is applied,
   the control chip includes a high-voltage control chip controlling the high-voltage power chip and a low-voltage control chip controlling the low-voltage power chip,
   the first recess is positioned on the high-voltage power chip side, and
   the second recess is positioned on the low-voltage control chip side.

5. The power module according to claim 4, wherein the power chip is made of a wide-band-gap semiconductor.

6. The power module according to claim 3, wherein the power chip is made of a wide-band-gap semiconductor.

7. The power module according to claim 2, wherein the power chip includes a high-voltage power chip and a low-voltage power chip to which a lower voltage than a voltage applied to the high-voltage power chip is applied,
   the control chip includes a high-voltage control chip controlling the high-voltage power chip and a low-voltage control chip controlling the low-voltage power chip,
   the first recess is positioned on the high-voltage power chip side, and
   the second recess is positioned on the low-voltage control chip side.

8. The power module according to claim 7, wherein the power chip is made of a wide-band-gap semiconductor.

9. The power module according to claim 2, wherein the power chip is made of a wide-band-gap semiconductor.

10. The power module according to claim 1, wherein no inner electrode is exposed from the side faces of the package on which the first and second recesses are provided.

11. The power module according to claim 10, wherein the power chip includes a high-voltage power chip and a low-voltage power chip to which a lower voltage than a voltage applied to the high-voltage power chip is applied,
    the control chip includes a high-voltage control chip controlling the high-voltage power chip and a low-voltage control chip controlling the low-voltage power chip,
    the first recess is positioned on the high-voltage power chip side, and
    the second recess is positioned on the low-voltage control chip side.

12. The power module according to claim 11, wherein the power chip is made of a wide-band-gap semiconductor.

13. The power module according to claim 10, wherein the power chip is made of a wide-band-gap semiconductor.

14. The power module according to claim 1, wherein the power chip includes a high-voltage power chip and a low-voltage power chip to which a lower voltage than a voltage applied to the high-voltage power chip is applied, the control chip includes a high-voltage control chip controlling the high-voltage power chip and a low-voltage control chip controlling the low-voltage power chip, the first recess is positioned on the high-voltage power chip side, and the second recess is positioned on the low-voltage control chip side.

15. The power module according to claim 14, wherein the power chip is made of a wide-band-gap semiconductor.

16. The power module according to claim 1, wherein the power chip is made of a wide-band-gap semiconductor.

17. The power module according to claim 1, wherein each of the first and second recesses extends into a first surface of the package that is transverse to the opposite side faces.

* * * * *